United States Patent
Theiss et al.

(10) Patent No.: US 6,667,215 B2
(45) Date of Patent: Dec. 23, 2003

(54) METHOD OF MAKING TRANSISTORS

(75) Inventors: Steven D. Theiss, Woodbury, MN (US); Paul F. Baude, Maplewood, MN (US); Michael A. Haase, Saint Paul, MN (US); Silva K. Theiss, Woodbury, MN (US)

(73) Assignee: 3M Innovative Properties, St. Paul, MN (US)

( * ) Notice: Subject to any disclaimer, the term of this patent is extended or adjusted under 35 U.S.C. 154(b) by 15 days.

(21) Appl. No.: 10/137,562

(22) Filed: May 2, 2002

(65) Prior Publication Data

US 2003/0207505 A1 Nov. 6, 2003

(51) Int. Cl.$^7$ .................. H01L 21/336; H01L 21/00; H01L 21/44; H01J 29/80; G06K 9/20
(52) U.S. Cl. .................. 438/299; 438/674; 438/679; 438/622; 438/623; 438/943; 438/944; 438/578; 438/586; 438/300; 438/681; 438/166; 438/149; 438/164; 313/402; 382/283; 216/12; 356/310
(58) Field of Search .................. 438/299, 674, 438/679, 622, 623, 943, 944, 578, 586, 300, 681, 161, 149, 164; 313/402; 382/283; 216/12; 356/310

(56) References Cited

U.S. PATENT DOCUMENTS

| | | | |
|---|---|---|---|
| 3,851,379 A | * | 12/1974 | Guthnecht et al. |
| 4,065,781 A | * | 12/1977 | Gutknecht |
| 4,262,296 A | * | 4/1981 | Shealy et al. |
| 4,301,191 A | * | 11/1981 | Peek |
| 4,337,115 A | * | 6/1982 | Ikeda et al. |
| 4,469,719 A | * | 9/1984 | Martin |
| 4,776,868 A | * | 10/1988 | Trotter, Jr. et al. |
| 4,883,770 A | * | 11/1989 | Dohler et al. |
| 5,238,861 A | | 8/1993 | Morin et al. |
| 5,264,383 A | | 11/1993 | Young |
| 5,294,869 A | | 3/1994 | Tang et al. |
| 5,294,870 A | | 3/1994 | Tang et al. |
| 5,500,537 A | * | 3/1996 | Tsumura et al. |
| 5,501,893 A | | 3/1996 | Laermer et al. |
| 5,595,944 A | * | 1/1997 | Zhang et al. |
| 5,612,228 A | * | 3/1997 | Shieh et al. |
| 5,625,199 A | | 4/1997 | Baumbach et al. |
| 6,037,712 A | | 3/2000 | Codama et al. |
| 6,091,196 A | | 7/2000 | Codama |
| 6,413,790 B1 | | 7/2002 | Duthaler et al. |
| 6,528,816 B1 | * | 3/2003 | Jackson et al. |
| 2001/0036691 A1 | | 11/2001 | Kitazume et al. |

FOREIGN PATENT DOCUMENTS

| | | |
|---|---|---|
| EP | 0 762 806 A2 | 3/1997 |
| EP | 1 003 221 A2 | 5/2000 |
| JP | 54062984 A * | 5/1979 |
| JP | 63172121 A * | 6/1988 |
| JP | 2000-132762 | 5/2000 |
| WO | WO 00/10196 | 2/2000 |

OTHER PUBLICATIONS

S. M. Sze, Physics of Semiconductor Devices, (1981), pp. 438–442, 492–493, 2$^{nd}$ Edition, John Wiley & Sons, New York.

C. D. Dimitrakopoulos et al., "Organic Thin–Film Transistors: A Review of Recent Advances", IBM J. Res. & Dev., (Jan. 2001), pp. 11–27, vol. 45, No. 1.

(List continued on next page.)

Primary Examiner—John F. Niebling
Assistant Examiner—Stanetta Isaac
(74) Attorney, Agent, or Firm—Lisa P. Fulton; Kent S. Kokko

(57) ABSTRACT

A method for making transistors comprises depositing source electrode and drain electrode features onto a substrate through a single aperture in a stationary shadow mask, said aperture having at least two opposing edges; wherein the shapes of the features are defined by the aperture and location of source materials in relation to the substrate.

26 Claims, 3 Drawing Sheets

OTHER PUBLICATIONS

L. C. Sander et al., "Polycyclic Aromatic Hydrocarbon Structure Index", NIST Special Publication 922 (Dec. 1997).

H. Klauk et al., "Pentacene Organic Thin–Film Transistors and ICs", Solid State Technology, (Mar. 2000), pp. 63–76, vol. 43, No. 3.

R. J. Jackman et al., "Fabrication of Submicrometer Features on Curved Substrates by Microcontact Printing", Science, (Aug. 4, 1995), pp. 664–665, vol. 269, No. 5224.

B. Crone et al., "Large–Scale Complementary Integrated Circuits Based on Organic Transistors", Nature, (Feb. 3, 2000), pp. 521–523, vol. 403, No. 6769.

P. F. Tian et al., "Precise, Scalable Shadow Mask Patterning, of Vacuum–Deposited Organic Light Emitting Devices", Journal of Vacuum Science & Technology A; Vacuum, Surfaces, and Films, (Sep./Oct. 1999), $2^{nd}$ Series, vol. 17, No. 5.

Z. Bao et al., "High–Performance Plastic Transistors Fabricated by Printing Techniques", Chemistry of Materials, (Jun. 1997), pp. 1299–1301, vol. 9, No. 6.

B. El–Kareh, "Fundamentals of Semiconductor Processing Technology", (1995), pp. 169–260, Kluwer Academic Publishers, Boston.

S. Sherr, "Matrix and Alphanumeric Devices", Electronic Displays, (1993), pp. 201–340, John Wiley and Sons, New York.

K. Finkenzeller, RFID Handbook, (1999), John Wiley and Sons, New York.

C. M. Hong et al., "Jet Printing of Copper Lines at 200° C. Maximum Process Temperature", Mat. Res. Soc. Symp. Proc., (2000), pp. 387–392, vol. 558.

T. Tsukada, "Active–Matrix Liquid–Crystal Displays", Technology and Applications of Amorphous Silicon, (2000), pp. 36–42, Springer–Verlag Berlin Heidelberg New York.

M. Madou Fundamentals of Microfabrication, (1997), pp. 166–179, CRC Press LLC.

U.S. patent application Ser. No. 09/966,954, "Process for Preparing Pentacene Derivatives", filed Sep. 26, 2001.

U.S. patent application Ser. No. 09/966,961, "Substituted Pentacene Semiconductors", filed Sep. 26, 2001.

U.S. patent application Ser. No. 09/886,447, "Method of Making Full Color Display Panels", filed Jun. 21, 2001.

U.S. patent application Ser. No. 10/076,003, Aperture Masks for Circuit Fabrication, filed Feb. 14, 2002.

U.S. patent application Ser. No. 10/076,005, In–Line Deposition Processes for Circuit Fabrication, filed Feb. 14, 2002.

U.S. patent application Ser. No. 10/076,174, Aperture Masks for Circuit Fabrication, filed Feb. 14, 2002.

* cited by examiner

METHOD OF MAKING TRANSISTORS

FIELD

This invention relates to a method of making transistors using a shadow mask. In another aspect, this invention relates to transistors comprising a shadow mask.

BACKGROUND

Traditionally, photolithography has been used for patterning transistors and circuits. The use of photolithography is undesirable, however, for low-cost, large-area applications because of its relatively high cost. Therefore, there has been an increasing effort in developing low-cost patterning techniques. Various patterning techniques have been proposed for low-cost, large-area applications, including printing methods and the use of mechanical shadow masks, but they can be problematic.

Known mechanical shadow mask techniques typically use a predefined/preformed system of mask levels. Each mask level must be precisely positioned so that it aligns with the previous layer. Registering rigid shadow masks within a desired level of accuracy (usually about 5 μm) over a web-handled substrate can be difficult in a low-cost, high-throughput environment.

In addition, depending upon processing conditions and substrate material, a transistor substrate may dilate or shrink during processing. If the substrate's size changes beyond some critical value, subsequent shadow mask levels can no longer be registered to those already on the substrate. Although this problem can be avoided by using a dynamic patterning process or by designing large tolerances into a rigid shadow mask, neither solution is ideal. Dynamic patterning processes can be costly and slow, and large design tolerances can ultimately reduce the performance of the circuits.

SUMMARY

In view of the foregoing, we recognize that there is a need for an economical method of patterning transistors for low-cost, large-area applications that eliminates the difficulty of aligning multiple levels. Furthermore, we recognize that it would be advantageous to have a shadow mask that deforms simultaneously with the substrate during processing.

Briefly, in one aspect, the present invention provides a method for patterning transistors using a stationary shadow mask (that is, a shadow mask that is stationary with respect to the substrate). The method comprises depositing source electrode and drain electrode features onto a substrate (that is, directly onto the substrate or onto another feature or layer that is on the substrate) through a single aperture in a stationary shadow mask, the aperture having at least two opposing edges; wherein the shapes of the features are defined by the aperture and location of source materials in relation to the substrate. Preferably, the shadow mask is permanently affixed to the substrate; more preferably, the shadow mask is permanently affixed to the substrate and the shadow mask is made of a material that has a lower modulus of elasticity than the substrate material.

It has been discovered that the above-described method avoids the issue of misregistration of transistor feature layers by using a single shadow mask to define each layer. On a web-handled substrate, the use of a single shadow mask to define each transistor results in a reduction in the number of alignment steps required, thus increasing throughput. In addition, at least some of the methods of the invention provide a patterning technique that uses a permanently affixed shadow mask. These shadow masks are not susceptible to problems caused by shrinkage or dilation of the substrate during processing because they deform simultaneously with the substrate.

Thus, the method aspects of the invention meet the need in the art for an economical way to pattern transistors for low-cost, large-area applications that eliminates the difficulty of aligning multiple feature levels.

In other aspects, this invention provides a method for depositing n-channel and p-channel complementary semiconductor materials adjacent to each other for use in complementary transistor circuit elements such as a metal oxide semiconductor (CMOS) element. This method comprises forming gate electrode, gate dielectric, source electrode, and drain electrode features on a substrate and depositing a first semiconductor material and a second semiconductor material through a single aperture in a stationary shadow mask, the aperture having at least two opposing edges, such that at least a portion of each of the semiconductor materials does not overlap the other semiconductor material. This method eliminates the difficulties associated with aligning multiple feature levels of transistors using multiple masks.

In still other aspects, this invention also provides articles comprising a transistor comprising a shadow mask permanently affixed to a substrate, and devices comprising the articles.

DETAILED DESCRIPTION

Figure 1:
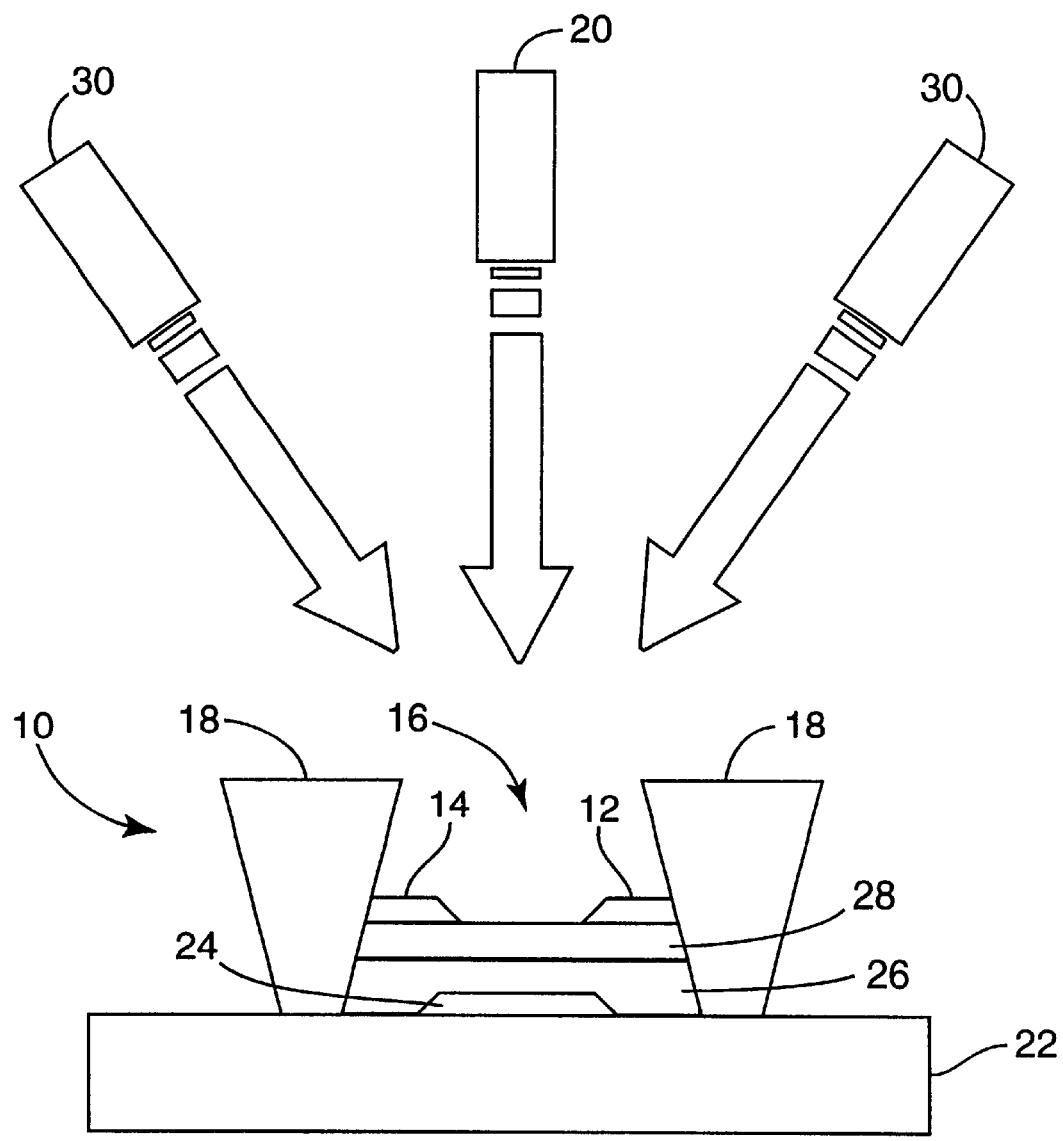
FIG. 1 depicts an embodiment of the invention.

The method of the invention for making transistors comprises depositing transistor features onto a substrate through a single aperture in a stationary shadow mask. A particularly useful type of transistor device, the thin-film transistor (TFT), generally includes a gate electrode feature, a gate dielectric feature adjacent to the gate electrode feature, a source electrode and a drain electrode feature adjacent to the gate dielectric feature, and a semiconductor layer adjacent to the gate dielectric feature and adjacent to the source and drain electrode features (see, for example, S. M. Sze, *Physics of Semiconductor Devices*, $2^{nd}$ edition, John Wiley and Sons, page 492, New York (1981)). As illustrated in FIG. 1, it has been discovered that a transistor 10 can be fabricated pursuant to this invention by depositing the source electrode 12 and drain electrode 14 features through a single aperture 16 of a shadow mask 18 from deposition sources 20, 30 held at a fixed angle to the substrate 22 (that is, by angled deposition). In addition, the gate electrode 24 and gate dielectric 26 features and the semiconductor layer 28 of the transistor can be deposited through the same single aperture 16 so that the entire transistor is fabricated using a single shadow mask. By utilizing a single shadow mask, the difficulty of aligning multiple feature levels of the transistor using multiple shadow masks is eliminated.

The aperture of the shadow mask and the location of source materials in relation to the substrate define the shapes of the transistor features. Preferably, the aperture is wider at its bottom (that is, the portion of the aperture adjacent to the substrate) than at its top. If the geometry of the system is properly designed, the source electrode and drain electrode features, deposited by angled evaporation, will be separated by a precisely defined channel length, determined by the height of the opposing edges of the shadow mask and the angle of the sources to the substrate normal. Typically, the opposing edges of the shadow mask are substantially parallel and substantially straight.

Preferably, the shadow mask is permanently affixed to the substrate so that the mask will deform simultaneously with the substrate during processing.

Preferably, the source electrode and drain electrode features are deposited from one or more sources, which are located at an angle or angles that are typically non-normal with respect to the substrate, such that the source electrode and drain electrode features are formed with a gap (or channel) between them. The source and drain electrode features may be deposited from a single source by moving the substrate with respect to the source (for example, rotating the substrate approximately 180°) between the deposition of each of the electrode features. Generally the substrate is moved substantially within the plane of the substrate, although it does not have to be exactly within the plane of the substrate. Alternatively, the source and drain electrode features may be deposited from separate sources located at opposite sides of the aperture.

Typically, the source electrode and drain electrode features are deposited such that a channel length of about 5 to about 50 $\mu$m (preferably about 5 to about 20 $\mu$m) separates them. The gate dielectric feature may be deposited over a different (for example, larger) area than the area covered by the gate electrode feature by utilizing sources at differing angles or at different distances from the substrate. Preferably, the gate dielectric feature completely covers the gate electrode feature in order to prevent shorting between the source and drain electrodes and the gate electrode. This can be accomplished by positioning the source for the gate dielectric feature closer to the substrate than the source for the gate electrode feature.

Figure 2A:
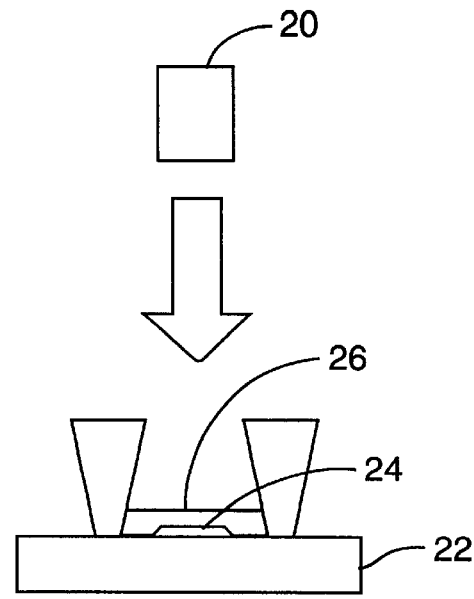
FIGS. 2a, 2b, and 2c depict a typical sequence for angled deposition of electrode features using a permanently affixed shadow mask.
Figure 2B:
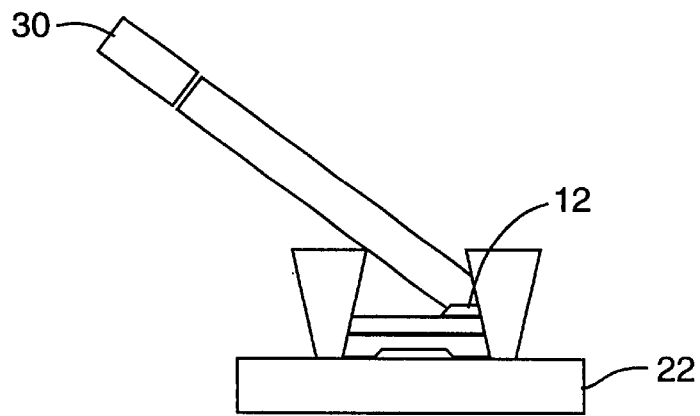
Figure 2C:
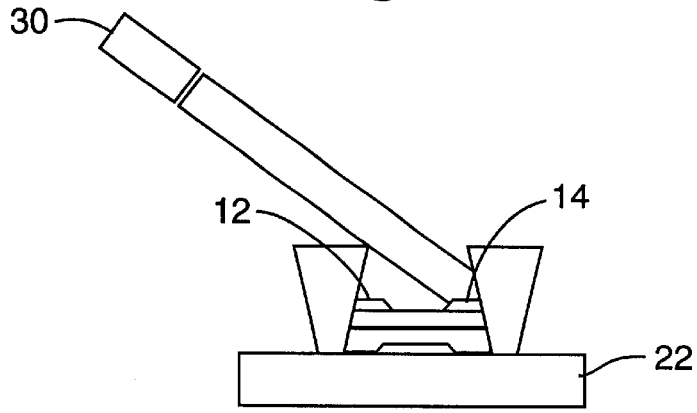

In a typical processing sequence to make a permanent shadow mask, a thick-film dry or wet resist is applied to the transistor substrate and patterned photolithographically. If a single source is used, the substrate can be held on a rotating fixture. In FIG. 2a, the gate electrode feature 24, the dielectric feature 26, and optionally the semiconductor layer 28 (not shown), and may be deposited from a source 20 normal to the substrate 22. The source electrode 12 and drain electrode 14 features are deposited by sources 30 at a fixed angle to the substrate. After the source electrode feature 12 (or the drain electrode feature 14) is deposited, as shown in FIG. 2b, a shutter is closed, the substrate is rotated 180°, the shutter is opened, and the other electrode feature is deposited, as shown in FIG. 2c. Alternatively, the source electrode feature and the drain electrode feature can be deposited from separate sources located at opposite sides of the aperture.

A plurality of transistors fabricated using the method described above can be deposited on a single substrate. The plurality of transistors can be connected to form a circuit. The interconnections between devices can be patterned prior to patterning the transistor.

Figure 3A:
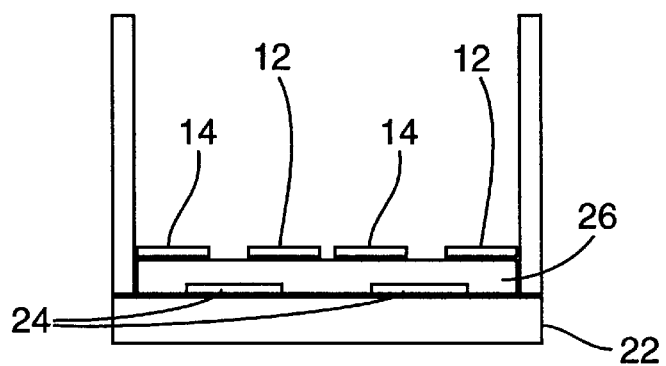
FIGS. 3a and 3b depict an embodiment of the invention that allows the deposition of complementary semiconductors adjacent to each other for use in CMOS circuit design.
Figure 3B:
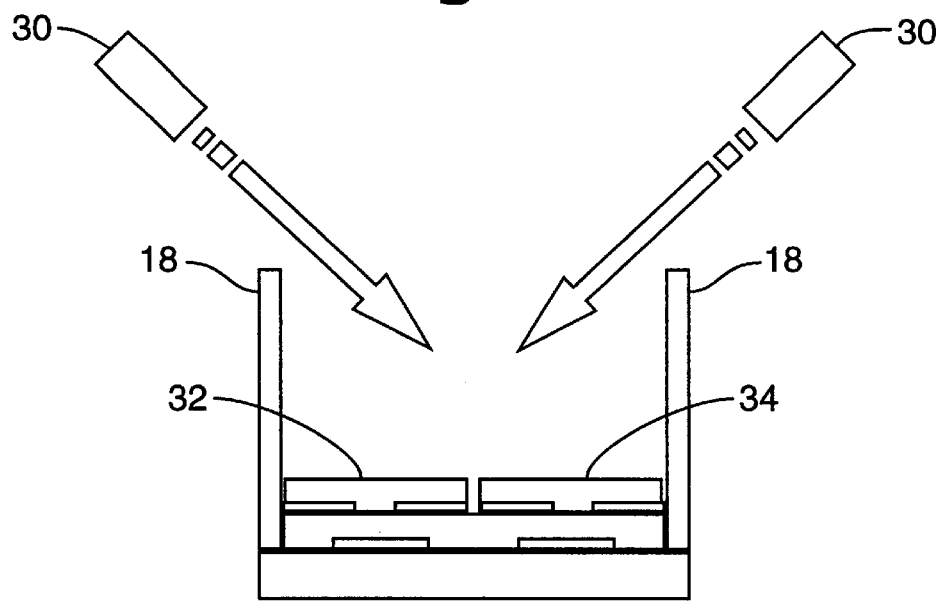

Another embodiment of the invention allows the deposition of p-channel and n-channel complementary semiconductors adjacent to each other for use in CMOS circuit design. The gate electrode features 24, the gate dielectric feature 26, and the source electrode 12 and drain electrode 14 features can be patterned using standard methods known in the art, as shown in FIG. 3a. Complementary semiconductor materials (that is, a first semiconductor layer 32 and a second semiconductor layer 34) are deposited from angled sources 30 through a single aperture in a shadow mask 18 to form semiconductor features such that at least a portion of each semiconductor feature does not overlap the other semiconductor feature, as shown in FIG. 3b. The aperture has at least two opposing edges. The deposition sources are held at an angle to the substrate, such that the different deposited semiconductor materials do not overlap in the center.

Figure 4:
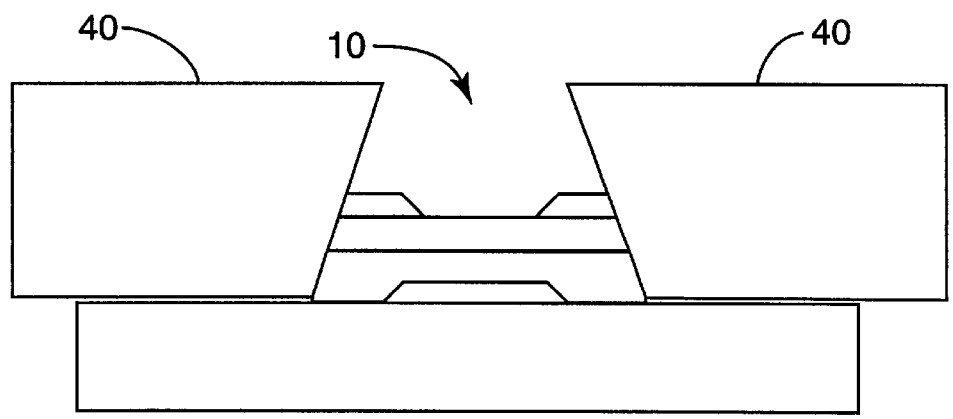
FIG. 4 depicts an embodiment of the invention with a removable shadow mask.

In yet another embodiment of the invention, a removable shadow mask 40 is used to pattern the features of a transistor 10, as shown in FIG. 4. Preferably, the removable shadow mask is also reusable. Using a removable shadow mask results in a substantially planar substrate (after deposition of the features and removal of the mask), which can, in some cases, be easier to use in subsequent processing steps than when a shadow mask is left affixed to the substrate.

Various electronic devices comprising transistors can be made using transistors fabricated by methods of this invention. The articles may comprise gate electrode, gate dielectric, source electrode, and drain electrode features, a semiconductor layer, a substrate, and a shadow mask permanently affixed to the substrate. The shadow mask comprises an aperture, which is preferably wider at its bottom than at its top. The source and drain electrode features may be on top of or beneath the semiconductor layer, but preferably they are on top of the semiconductor layer.

Preferably, the gate dielectric feature covers a larger area than the area covered by the gate electrode feature. This can be achieved by positioning the source for the dielectric feature closer to the substrate than the source for the gate electrode feature. It is preferable that the gate dielectric feature completely covers the gate electrode feature.

In another embodiment, the article may have gate electrode, gate dielectric, source electrode, and drain electrode features, a first semiconductor feature, a second semiconductor feature, a substrate, and a permanently affixed shadow mask comprising an aperture. In this embodiment, at least a portion of each said semiconductor feature does not overlap the other semiconductor feature.

The articles of the invention can be used in integrated circuits comprising a plurality of transistors having an integrated shadow mask, as well as in various electronic systems. Such systems include, for example, radio frequency identification (RFID) tags (described in, for example, K. Finkenzeller, *RFID Handbook*, John Wiley and Sons, New York (1999)), sensor devices, display devices (for use in, for example, personal computers, cell phones, or handheld devices) (described in, for example, S. Sherr, *Electronic Displays*, John Wiley and Sons, pp. 201–340, New York (1993)), and the like.

Shadow Mask

The transistor features are deposited through a single aperture in a stationary shadow mask. The aperture has at least two opposing edges. A shadow mask suitable for use in this method may be permanently affixed to or constructed on (or as part of) the transistor substrate before fabricating the transistor. Such shadow masks may comprise photoresist, including wet or dry film photoresist, and may be made by conventional photolithography (as described in, for example, B. El-Kareh, Fundamentals of Semiconductor Processing Technologies, Kluwer Academic Publishers, pp. 169–252, Boston (1995)). Dry film photoresist can be applied with a roller. Alternatively, the shadow mask may be removable. Preferably, the removable shadow masks are also reusable. Materials suitable for making a removable shadow mask include crystalline materials such as silicon, metal materials such as copper and steel, and polymeric materials such as those comprising polyimide, polyester, polystyrene, polymethylmethacrylate, polycarbonate, or combinations thereof. A removable shadow mask is typically made by removing material from where the aperture(s) will be located, while leaving the material that forms the mask intact. A removable shadow mask may be patterned by a variety of techniques, including conventional machining; micromachining; diamond machining; laser ablation; or chemical, plasma, or ion beam etching (typically defined by photolithography). Electric discharge machining (EDM), also called electrodischarge or spark-erosion machining, is a well-known technique that can be used for making a shadow mask. EDM erodes material in the path of electrical discharges that form an arc between an electrode tool (for example, a wire) and the work piece.

Wafers of crystalline materials (for example, silicon, germanium, or gallium arsenide) are well suited for making removable, reusable masks for angle evaporation. Silicon wafers polished on both sides and of an appropriate thickness (for example, approximately 100 to 200 μm) are widely available. The shadow mask can be fabricated with well-known processes including photolithography and etching (described in, for example, B. El-Kareh, Fundamentals of Semiconductor Processing Technologies, Kluwer Academic Publishers, pp. 169–252, Boston (1995)). The pattern of apertures may be etched through the wafer by any appropriate technique, including anisotropic wet chemical etching (described in, for example, Marc Madou, Fundamentals of Microfabrication, CRC Press, pp. 168–176 (1997)) or anisotropic ion etching (see, for example, U.S. Pat. No. 5,501,893).

Substrate

A substrate typically supports the transistor during manufacturing, testing, and/or use. Optionally, the substrate can provide an electrical function for the transistor. Useful substrate materials include organic and inorganic materials. For example, the substrate can comprise inorganic glasses, ceramic foils, polymeric materials (for example, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly (ethylene naphthalenedicarboxylate) (PEN), poly(ethylene terephthalate) (PET), poly(phenylene sulfide) (PPS)), filled polymeric materials (for example fiber-reinforced plastics (FRP)), and coated metallic foils. Preferably, the substrate is flexible (that is, capable of being wound on a roll having a diameter of less than one meter).

Gate Electrode Feature

The gate electrode feature can be made of any useful conductive material. For example, the gate electrode feature can comprise doped silicon, or a metal, such as aluminum, chromium, gold, silver, nickel, palladium, platinum, tantalum, or titanium. Conductive polymers can also be used, for example polyaniline or poly(3,4-ethylenedioxythiopene)/poly(styrene sulfonate) (PEDOT:PSS). In addition, alloys, combinations, and multilayers of these materials can be useful. In some transistors, the same material can provide the gate electrode function and also provide the support function of the substrate. For example, doped silicon can function as the gate electrode feature and support the transistor.

Gate Dielectric Feature

The gate dielectric feature is generally situated adjacent to the gate electrode feature. This gate dielectric feature electrically insulates the gate electrode feature from the balance of the transistor device. Useful materials for the gate dielectric feature can comprise, for example, an inorganic electrically insulating material.

Specific examples of materials useful for the gate dielectric feature include strontiates, tantalates, titanates, zirconates, aluminum oxides, silicon oxides, tantalum oxides, titanium oxides, silicon nitrides, barium titanate, barium strontium titantate, barium zirconate titanate, zinc selenide, and zinc sulfide. In addition, alloys, combinations, and mulitlayers of these materials can be used for the gate dielectric feature.

Source Electrode and Drain Electrode Features

The source electrode and drain electrode features are separated from the gate electrode feature by the gate dielectric feature, while the semiconductor layer can be over or under the source electrode and the drain electrode features. The source electrode and the drain electrode features can be any useful conductive material. Useful materials include most of those materials described above for the gate electrode feature, for example, aluminum, barium, calcium, chromium, gold, silver, nickel, palladium, platinum, titanium, polyaniline, PEDOT:PSS, other conducting polymers, alloys thereof, combinations thereof, and multilayers thereof. Some of these materials are appropriate for use with electron-conducting semiconductor materials and others are appropriate for use with hole-conducting semiconductor materials, as is known in the art.

Semiconductor Layer

The semiconductor layer may comprise organic or inorganic semiconductor materials. Useful inorganic semiconductor materials include amorphous silicon, cadmium sulfide, cadmium selenide, and tellurium. Useful organic semiconductor materials include acenes and substituted derivatives thereof. Particular examples include anthracene, naphthalene, tetracene, pentacene, and substituted pentacenes (preferably pentacene or substituted pentacenes). Other examples include semiconducting polymers, perylenes, fullerenes, phthalocyanines, oligothiophenes, and substituted derivatives thereof.

Substituted derivatives of acenes include acenes substituted with at least one electron-donating group, halogen atom, or a combination thereof, or a benzo-annellated acene or polybenzo-annellated acene, which optionally is substituted with at least one electron-donating group, halogen atom, or a combination thereof. The electron-donating group is selected from an alkyl, alkoxy, or thioalkoxy group having from 1 to 24 carbon atoms. Preferred but non-limiting examples of alkyl groups are methyl, ethyl, n-propyl, isopropyl, n-butyl, sec-butyl, n-pentyl, n-hexyl, n-heptyl, 2-methylhexyl, 2-ethylhexyl, n-octyl, n-nonyl, n-decyl, n-dodecyl, n-octadecyl, and 3,5,5-trimethylhexyl.

Substituted pentacenes and methods of making them are taught in copending applications U.S. Ser. No. 09/966,954 and U.S. Ser. No. 09/966,961, both filed on Sep. 26, 2001, which are herein incorporated by reference.

Further details of benzo-annellated and polybenzo-annellated acenes can be found in the art, for example, in NIST Special Publication 922 "Polycyclic Aromatic Hydrocarbon Structure Index", U.S. Govt. Printing Office, by Sander and Wise (1997). When the semiconductor layer comprises a first semiconductor material and a second semiconductor material, for example, in CMOS circuit design, both semiconductor materials may be inorganic or at least one (or both) of the semiconductor materials may be organic (see, for example, U.S. Pat. No. 5,625,199). Useful materials for CMOS circuit design include those semiconductor materials listed above. Preferably, at least one of the semiconductor materials comprises pentacene, substituted pentacene, or amorphous silicon; more preferably, one semiconductor material is amorphous silicon and the other semiconductor material is pentacene or substituted pentacene.

EXAMPLE

Objects and advantages of this invention are further illustrated by the following example, but the particular materials and amounts thereof recited in these examples, as well as other conditions and details, should not be construed to unduly limit this invention.

A shadow mask having a series of ribs, which define apertures, was prepared using a dry-film photoresist. Preparation of the shadow mask ribs consisted of laminating 2 layers of 100 micrometer dry film resist (Shipley Laminar 5040, available from Shipley Company, L.L.C., 455 Forest Street, Marlborough, Me.) onto a thermally oxidized silicon wafer and UV exposure of the resist through an appropriate lithography mask. The exposed resist was then processed according to the manufacturer's specifications. The height and width of the resulting ribs were about 190 and about 135 micrometers, respectively, and the center-to-center spacing of the ribs was about 300 micrometers.

The shadow mask was formed on a substrate. The substrate was comprised of the silicon oxide side of a single crystal <100> orientation silicon wafer (obtained from Silicon Valley Microelectronics, San Jose, Calif.), which had a 1000 Å layer of high temperature thermal silicon oxide on the front and a 5000 Å layer of aluminum metal vapor deposited onto the backside of the wafer. A metal-foil mask with 1 mm lines and spaces was placed on top of the dry-film shadow mask with the lines perpendicular to the ribs to define separate transistors. Source and drain electrodes (Au) were then deposited onto the silicon oxide layer of the masked wafer by angled evaporation by first depositing one electrode set, rotating the masked wafer 180°, and depositing the other electrode set. The angle was set to provide a channel length of about 20 micrometers between the source and drain electrodes. The resulting sample was exposed to hexamethyldisilazane (HMDS) at room temperature for 10 minutes prior to depositing the semiconductor layer.

Pentacene (available from Aldrich Chemical) was purified using a 3-zone furnace (Thermolyne 79500 tube furnace, from Barnstead Thermolyne, Dubuque, Iowa) at reduced pressure under a constant flow of nitrogen gas. The purified pentacene was deposited to a thickness of 400 Å by sublimation under vacuum (approximately $10^{-6}$ Torr (or $1.33 \times 10^{-4}$ Pa)) onto the HMDS treated sample surface (that is, the source and drain electrodes and the gap between them) held at 65° C.

Transistor performance of the resulting thin film transistors (TFTs), with the aluminum layer acting as the common gate electrode, was tested at room temperature in air using techniques known in the art, for example as shown in S. M. Sze, *Physics of Semiconductor Devices*, page 442, John Wiley & Sons, New York, 1981, which is herein incorporated by reference. For example, plots of drain current, $I_D$, versus drain voltage, $V_D$, at gate-source bias levels of 0V to −60V indicated that the TFTs were fully functional. A semiconductor parameter analyzer (model 4145A from Hewlett-Packard, San Jose, Calif.) was used.

The complete disclosures of the publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:

1. A method of making a transistor comprising: depositing source electrode and drain electrode features onto a substrate through a single aperture in a stationary shadow mask, said aperture having at least two opposing edges; wherein the shapes of the features are defined by the aperture and location of source materials in relation to the substrate.

2. The method of claim 1 wherein the substrate is flexible.

3. The method of claim 1 wherein said shadow mask is removable.

4. The method of claim 3 wherein said removable mask is reusable.

5. The method of claim 1 wherein said shadow mask is permanently affixed to the substrate.

6. The method of claim 1 further comprising depositing gate electrode and gate dielectric features through said single aperture.

7. The method of claim 1 further comprising depositing a semiconductor layer through said single aperture.

8. The method of claim 7 wherein said semiconductor layer is organic.

9. The method of claim 8 wherein the source electrode and drain electrode features are deposited on top of said semiconductor layer.

10. The method of claim 8 wherein said semiconductor layer comprises pentacene or substituted pentacene.

11. The method of claim 7 wherein said semiconductor layer is inorganic.

12. The method of claim 11 wherein said semiconductor layer comprises amorphous silicon.

13. A method of making a device comprising: forming gate electrode, gate dielectric, source electrode, and drain electrode features on a substrate and depositing a first semiconductor material and a second semiconductor material through a single aperture in a stationary shadow mask, said aperture having at least two opposing edges, such that at least a portion of each said semiconductor material does not overlap the other semiconductor material.

14. The method of claim 13 wherein the substrate is flexible.

15. The method of claim 13 wherein both said first semiconductor material and said second semiconductor material are inorganic.

16. The method of claim 13 wherein at least one of said semiconductor materials is organic.

17. The method of claim 16 wherein one of said semiconductor materials comprises pentacene or substituted pentacene.

18. The method of claim 13 wherein at least one of said semiconductor comprises amorphous silicon.

19. The method of claim of claim 13 wherein said first semiconductor material is amorphous silicon and said second semiconductor material is pentacene.

20. The method of claim 1 wherein the source electrode and drain electrode features are deposited from one or more sources located at an angle or angles with respect to the substrate such that said features are formed with a gap between them.

21. The method of claim 20 wherein said source electrode and drain electrode features are deposited from a single source by moving the substrate with respect to the source between the deposition of each said electrode feature.

22. The method of claim 20 wherein said source electrode and drain electrode features are deposited from separate sources located at opposite sides of said aperture.

23. The method of claim 1 wherein said aperture is wider at its bottom than at its top.

24. The method of claim 6 wherein said gate dielectric feature is deposited from one or more sources located at positions relative to the substrate, such that said gate dielectric feature covers a larger area than the area covered by the gate electrode feature.

25. The method of claim 1 wherein a plurality of transistors is deposited on a single substrate.

26. The method of claim 25 further comprising connecting said plurality of transistors to form a circuit.

* * * * *

UNITED STATES PATENT AND TRADEMARK OFFICE
CERTIFICATE OF CORRECTION

PATENT NO.    : 6,667,215 B2                                                Page 1 of 1
DATED         : December 23, 2003
INVENTOR(S)   : Theiss, Steven D.

It is certified that error appears in the above-identified patent and that said Letters Patent is hereby corrected as shown below:

Column 7,
Line 34, delete "Me." and insert -- MA --, therefore.

Signed and Sealed this

Fifteenth Day of November, 2005

JON W. DUDAS
*Director of the United States Patent and Trademark Office*